(12) United States Patent
Li et al.

(10) Patent No.: US 7,745,900 B2
(45) Date of Patent: Jun. 29, 2010

(54) METHOD AND APPARATUS PROVIDING REFRACTIVE INDEX STRUCTURE FOR A DEVICE CAPTURING OR DISPLAYING IMAGES

(75) Inventors: Jiutao Li, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 830 days.

(21) Appl. No.: 11/209,752

(22) Filed: Aug. 24, 2005

(65) Prior Publication Data

US 2007/0045678 A1  Mar. 1, 2007

(51) Int. Cl.
*H01L 27/14* (2006.01)
(52) U.S. Cl. .................. 257/437; 257/94; 257/E31.119
(58) Field of Classification Search .................... 257/94, 257/96, 97, 101, 437, E31.119
See application file for complete search history.

(56) References Cited

U.S. PATENT DOCUMENTS

| | | | | |
|---|---|---|---|---|
| 4,152,044 A | * | 5/1979 | Liu | 385/131 |
| 4,217,598 A | * | 8/1980 | d'Auria et al. | 257/85 |
| 4,649,088 A | * | 3/1987 | Mitsui et al. | 428/697 |
| 5,181,084 A | * | 1/1993 | Bommer et al. | 257/94 |
| 5,659,815 A | * | 8/1997 | Uematsu et al. | 396/121 |
| 6,444,898 B1 | * | 9/2002 | Fujisawa et al. | 136/256 |
| 6,579,624 B2 | * | 6/2003 | Choi et al. | 428/610 |
| 7,329,912 B2 | * | 2/2008 | Yaung | 257/236 |
| 2006/0045162 A1 | * | 3/2006 | Johnson | 372/99 |

FOREIGN PATENT DOCUMENTS

JP  02245702 A  * 10/1990

* cited by examiner

*Primary Examiner*—Allan R. Wilson
(74) *Attorney, Agent, or Firm*—Dickstein Shapiro LLP

(57) ABSTRACT

A transient index stack having an intermediate transient index layer, for use in an imaging device or a display device, that reduces reflection between layers having different refractive indexes by making a gradual transition from one refractive index to another. Other embodiments include a pixel array in an imaging or display device, an imager system having improved optical characteristics for reception of light by photosensors and a display system having improved optical characteristics for transmission of light by photoemitters. Enhanced reception of light is achieved by reducing reflection between a photolayer, for example, a photosensor or photoemitter, and surrounding media by introducing an intermediate layer with a transient refractive index between the photolayer and surrounding media such that more photons reach the photolayer. The surrounding media can include a protective layer of optically transparent media.

26 Claims, 11 Drawing Sheets

METHOD AND APPARATUS PROVIDING REFRACTIVE INDEX STRUCTURE FOR A DEVICE CAPTURING OR DISPLAYING IMAGES

FIELD OF THE INVENTION

The invention relates to solid state imagers, display devices, and more particularly to optical paths used in solid state imagers and display devices.

BACKGROUND OF THE INVENTION

Solid state imagers generate electrical signals in response to light reflected by an object being imaged. Complementary metal oxide semiconductor (CMOS) imagers are one of several different known types of semiconductor-based imagers, which include for example, charge coupled devices (CCDs), photodiode arrays, charge injection devices and hybrid focal plane arrays.

Some inherent limitations in CCD technology have promoted an increasing interest in CMOS imagers for possible use as low cost imaging devices. A fully compatible CMOS imager technology enabling a higher level of integration of an image array with associated processing circuits would be beneficial to many digital image capture applications. CMOS imagers have a number of desirable features, including for example low voltage operation and low power consumption. CMOS imagers are also compatible with integrated on-chip electronics (control logic and timing, image processing, and signal conditioning such as A/D conversion). CMOS imagers allow random access to the image data, and have lower manufacturing costs, as compared with conventional CCDs, since standard CMOS processing techniques can be used to fabricate CMOS imagers. Additionally, CMOS imagers have low power consumption because only one row of pixels needs to be active at any time during readout and there is no charge transfer (and associated switching) from pixel to pixel during image acquisition. On-chip integration of electronics is particularly desirable because of the potential to perform many signal conditioning functions in the digital domain (versus analog signal processing) as well as to achieve reductions in system size and cost.

Nevertheless, demands for enhanced resolution of CCD, CMOS and other solid state imaging devices, and a higher level of integration of imaging arrays with associated processing circuitry, are accompanied by a need to improve the light sensing characteristics of the pixels of the imaging arrays. For example, it would be beneficial to minimize, if not eliminate, the loss of light transmitted to individual pixels during image acquisition and the amount of crosstalk between pixels caused by light being scattered or shifted from one pixel to a neighboring pixel.

A significant source of photon reflection can occur at the junction of different media, each having a different refractive index. Photon reflection between two different media can be expressed by the following formula:

$$R = \frac{(n_1 - n_2)^2}{(n_1 + n_2)^2}$$

where $n_1$ and $n_2$ are the refractive indices of the two media and R is the percentage of photons reflected at the junction of the two media.

Silicon and silicon oxide layers are required in many conventional CMOS photosensor structures because of the limitations of conventional CMOS technology and the high quantum efficiency of a crystallized silicon based photodiode.

With reference to FIGS. 1(a)-(c), which respectively illustrate a top-down view, a partial cross-sectional view and electrical circuit schematic of a conventional CMOS pixel sensor cell 100, when incident light 187 strikes the surface of a photosensor (photodiode) 120, electron/hole pairs are generated in the p-n junction of the photosensor (represented at the boundary of n-type accumulation region 122 and p-type surface layer 123 [FIG. 1(b)]). The generated electrons (photo-charges) are collected in the n-type accumulation region 122 of the photosensor 120. The photo-charges move from the initial charge accumulation region 122 to a floating diffusion region 110 via a transfer transistor 106. The charge at the floating diffusion region 110 is typically converted to a pixel output voltage by a source follower transistor 108 and then output on a column output line 111 via a row select transistor 109.

Conventional CMOS imager designs, such as that shown in FIGS. 1(a)-(c) for pixel cell 100, include a substrate 101 having a photosensor 120 and isolation regions 102. The floating diffusion region 110 is coupled to a transfer transistor gate 106' of the transfer transistor 106. Source/drain regions 115 are provided for reset 107, source follower 108, and row select 109 transistors which have respective gates 107', 108', and 109'. A silicon dioxide layer 150 is typically formed over the substrate 101 to form a silicon-silicon dioxide stack, for example, as a protective layer.

A silicon/silicon dioxide stack 20 is shown in FIG. 2(a). A first layer 22 having a first refractive index, which corresponds to silicon dioxide layer 150 of FIG. 1(b), is formed on a second layer 21 having a second refractive index, corresponding to silicon substrate 101 of FIG. 1(b). However, formation of silicon dioxide on top of a silicon photodiode can lead to significant reflection at the junction of the two layers. Where the first layer is silicon dioxide (at or about n=1.45) and the second layer is silicon (at or about n=4), the stack 20 produces reflection R of about 22% of photons at the junction 23 of the first and second layers.

FIG. 2(b) shows a plot of the refractive index n of the stack of FIG. 2(a) relative to depth d. At the depth of junction 23, the refractive index n rises sharply from 1.5 to 4.0. FIG. 2(c) shows a plot of the total reflection R within the stack of FIG. 2(a) relative to depth d. At the junction 23, where n jumps from 1.5 to 4.0, the percentage reflection R spikes to 22%, which is undesirable. Referring back to FIG. 1(b), a significant quantity of photons is reflected at the junction between substrate 101 and silicon dioxide layer 150, and thus are not detected by the imager.

Accordingly, there is a need and desire for an improved solid state imaging device, capable of receiving and propagating light with minimal loss of light transmission to a photosensor. There is also a need and desire for improved fabrication methods for imaging devices that provide a high level of light transmission to the photosensor and reduce the light scattering drawbacks of the prior art, such as crosstalk and photon reflection.

There is also a need for improved display devices which utilize an array of photoemitters for light emission which also have improved light propagating properties.

BRIEF SUMMARY OF THE INVENTION

Exemplary embodiments of the invention provide a transient index stack having an intermediate transient index layer, for use in an imaging device or a display device, that reduces reflection between layers having different refractive indexes by making a gradual transition from one refractive index to another. Other embodiments include a pixel array in an imaging or display device, an imager system having improved optical characteristics for reception of light by photosensors and a display system having improved optical characteristics for transmission of light by photoemitters. Enhanced reception of light is achieved by reducing reflection between a photolayer, for example, a photosensor or photoemitter, and surrounding media by introducing an intermediate layer with a transient refractive index between the photolayer and surrounding media such that more photons reach the photolayer. The surrounding media can include a protective layer of optically transparent media.

Methods for forming an imaging device, in accordance with exemplary embodiments of the invention, include forming one or more intermediate transient index layers between media layers, having different indexes of refraction, disposed over focal plane arrays of photosensors. The exemplary methods include the acts of forming photosensors on a wafer, providing an intermediate transient index layer, and providing an optically transparent medium over the intermediate transient index layer, for example, as a protective layer. A color filter layer may also be fabricated with an individual color filter over a respective photosensor/intermediate transient index layer stack and a microlens structure layer can be fabricated over the color filter layer.

Also disclosed are structures and fabrication methods for optical paths used in display devices which have improved optical characteristics for transmission of light from photoemitters.

These and other features and advantages of the invention will be more apparent from the following detailed description that is provided in connection with the accompanying drawings illustrating exemplary embodiments of the invention.

DETAILED DESCRIPTION

In the following detailed description, reference is made to various specific embodiments which exemplify the invention. These embodiments are described with sufficient detail to enable those skilled in the art to practice the invention, and it is to be understood that other embodiments may be employed, and that structural and logical changes may be made without departing from the spirit or scope of the invention.

The term "substrate" used in the following description may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

An intermediate layer having a transient refractive index is particularly advantageous when formed between a silicon photosensor layer and a protective silicon dioxide layer such as those found in, e.g., CMOS imager pixel cells. The intermediate layer may be formed by different methods, for example, by silicon quantum dot formation, by reactive physical vapor deposition ("PVD"), or by chemical vapor deposition ("CVD").

Silicon quantum dot formation creates silicon "dots" each having a diameter smaller than the wavelength of visible light in an intermediate silicon dioxide layer. By forming dots such that the size and/or distribution density of the dots decreases uniformly from the silicon layer to the silicon dioxide layer, the reflection is minimized at the junctions of the intermediate layer and the respective silicon and silicon dioxide layers, and throughout the intermediate layer.

Reactive PVD and CVD deposition can also generate an intermediate layer having reduced photon reflection by gradually increasing oxygen flow during deposition of silicon. By controlling the oxygen flow as a function of deposition time, the resultant intermediate transient layer has a smooth transition from pure silicon to silicon dioxide.

Figure 3C:
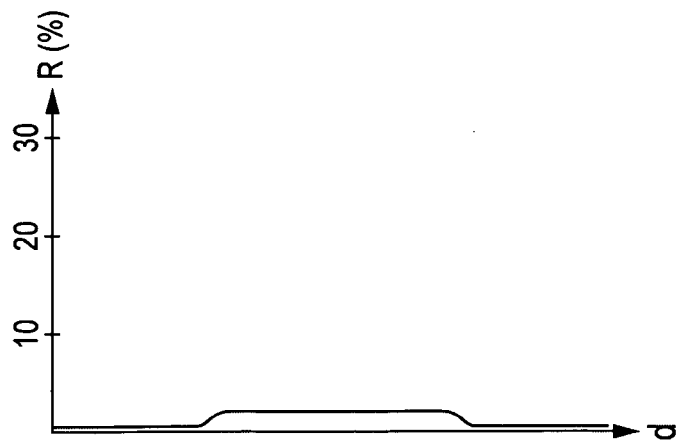
FIG. 3(c) is a plot of the percentage reflection R within the stack of FIG. 3(a) relative to depth d.
Figure 3B:
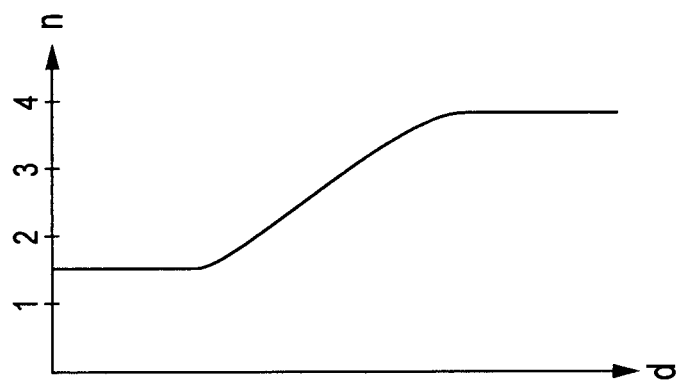
FIG. 3(b) is a plot of the transient index n of the stack of FIG. 3(a) relative to depth.
Figure 3A:
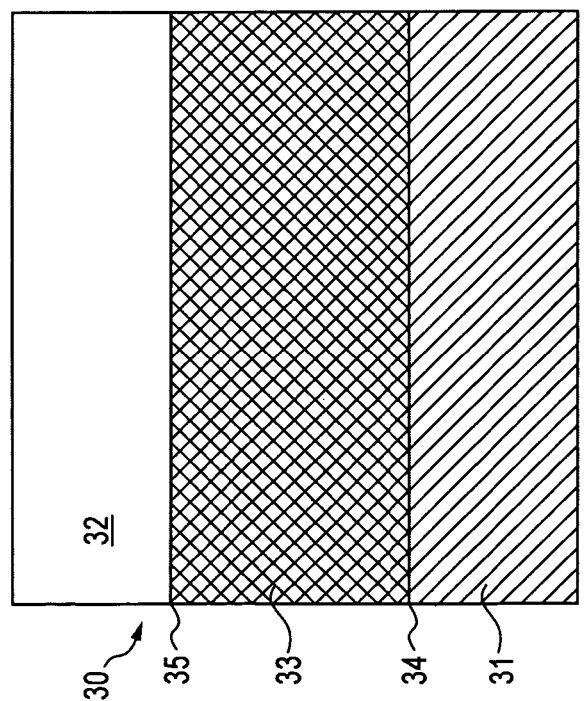
FIG. 3(a) is a cross sectional view of a stack having a silicon dioxide layer formed on a silicon layer and also having an intermediate transient index stack in accordance with a first exemplary embodiment of the invention.

FIG. 3(a) is a cross sectional view of an optical stack 30 formed in accordance with a first exemplary embodiment of the invention. The stack 30 comprises a silicon base layer 31, a silicon dioxide layer 32 and an intermediate transient layer 33 between layers 31 and 32. The intermediate transient layer 33 has a refractive index at or about n=4.0 at the junction 34 between the silicon base layer 31 and the intermediate transient layer 33 and a refractive index at or about n=1.5 at the junction 35 between the silicon dioxide layer 32 and the intermediate transient layer 33. The refractive index n of the intermediate transient layer gradually transitions from at or about n=1.5 at junction 34 to at or about n=4.0 at junction 35, thereby reducing reflection at the junctions 34, 35 and throughout the intermediate transient layer 33.

The intermediate transient layer may be formed on a silicon substrate, for example, by adding silicon dioxide in increasing proportion during layer formation until a pure silicon dioxide layer is achieved. More specifically, an intermediate transient index may be formed on a silicon substrate by using reactive sputter PVD deposition of silicon; by gradually increasing flow of oxygen during the reactive sputter deposition, the refractive index n of the intermediate transient index layer would gradually increase from at or about n=1.5 to at or about n=4.0 for example. Similarly, CVD deposition can achieve the same results, by increasing the proportion of precursors as a function of layer depth.

Figure 2C:
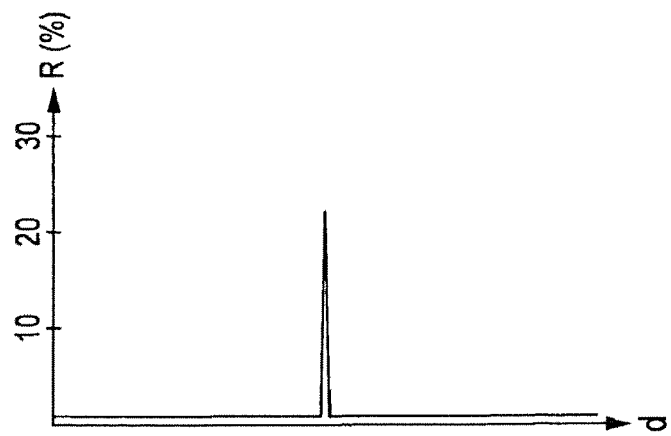
FIG. 2(c) is a plot of the total reflection R within the stack of FIG. 2(a) relative to depth d.
Figure 2B:
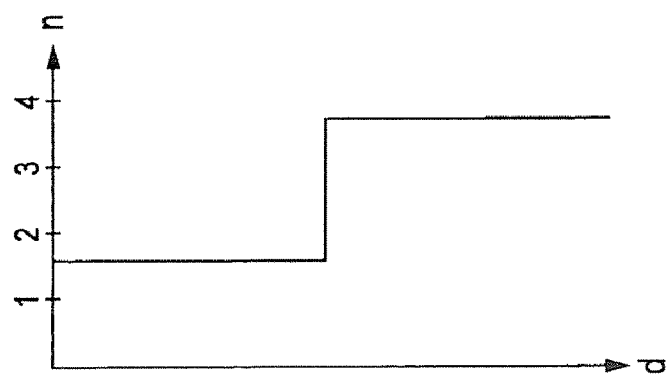
FIG. 2(b) is a plot of the transient index n of the stack of FIG. 2(a) relative to depth d.

FIG. 3(b) is a plot of the transient refractive index n of the stack of FIG. 3(a) relative to depth d. Unlike the plot shown in FIG. 2(b), FIG. 3(b) shows a change in refractive index n relative to depth d that is more gradual and less abrupt than at the junction 23 in FIG. 2(b).

Figure 2A:
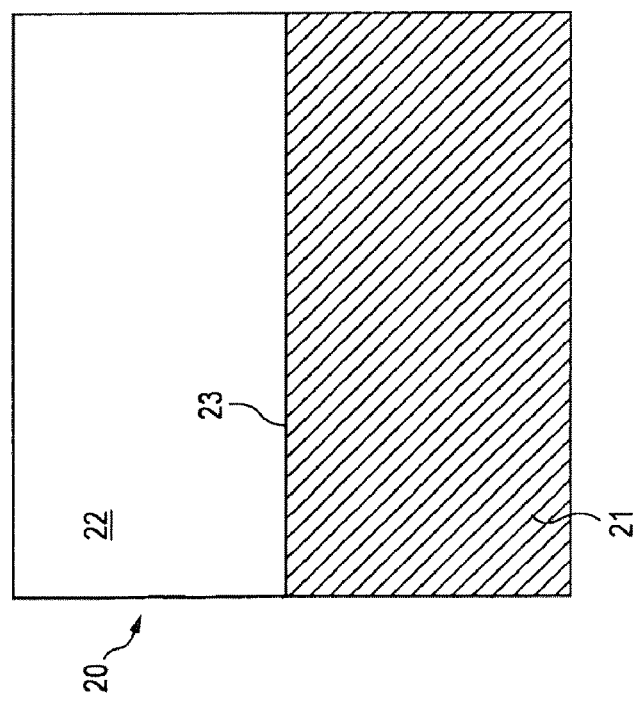
FIG. 2(a) is a cross sectional view of an optical stack having a silicon dioxide layer formed on a silicon layer according to the prior art.

FIG. 3(c) shows a plot of the total reflection R within the stack of FIG. 3(a) relative to depth d. Here, the reflection increases with the change in n shown in FIG. 3(b), but to a lesser extent than in the conventional stack 20, as shown in FIGS. 2(a) and 2(c). Fewer photons are reflected at junction, and many photons can be recovered once they enter the intermediate transient layer because the same change in refractive index n will re-reflect a percentage of the reflected photons back in the correct direction. This photon recovery is not possible with the conventional stack 20 of FIG. 2(a), which has no way to re-reflect photons that have been reflected at junction 23.

Figure 4C:
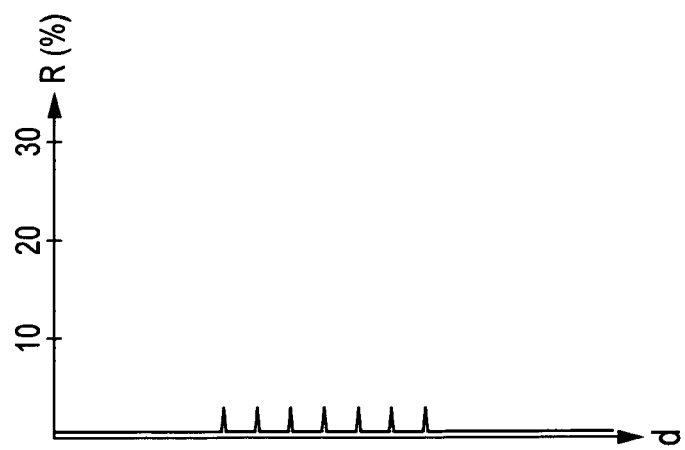
FIG. 4(c) is a plot of the percentage reflection R within the stack of FIG. 4(a) relative to depth d.
Figure 4B:
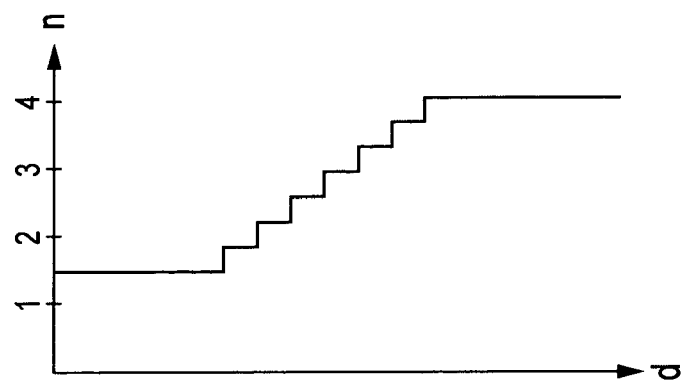
FIG. 4(b) is a plot of the transient index n of a stack of FIG. 4(a), relative to depth.
Figure 4A:
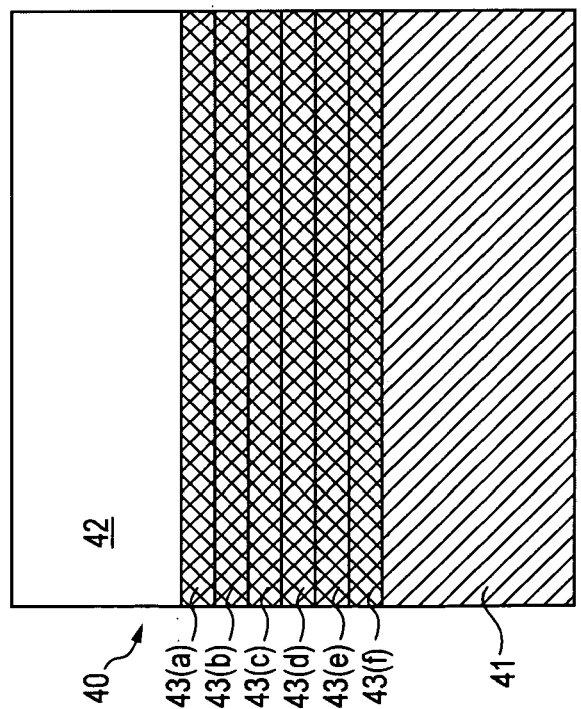
FIG. 4(a) is a cross sectional view of a stack having a silicon dioxide layer formed on a silicon layer and also having an intermediate transient index stack in accordance with a second exemplary embodiment of the invention.

FIG. 4(a) is a cross sectional view of a stack 40 having a silicon dioxide layer 42 formed over a silicon layer 41 and with an intermediate transient index stack 43 in accordance with a second exemplary embodiment of the invention formed therebetween. In this embodiment, discrete layers 43(a)-(f) having incrementally larger refractive indexes in the direction of the substrate are formed over the silicon substrate 41. In the illustrated embodiment, beginning with a silicon substrate 41, each discrete intermediate layer 43(a)-(f) has an incrementally higher proportion of silicon dioxide than the prior layer, ultimately reaching pure silicon dioxide concentration in the final layer 43(a). A uniform silicon dioxide layer 42 may then be formed over the intermediate transient index stack 43.

FIG. 4(b) is a plot of the transient refractive index n of the stack of FIG. 4(a) relative to depth d. Here, the change in refractive index n relative to depth d takes place incrementally and reduces overall reflection. FIG. 4(c) is a plot of the percentage reflection R within the stack of FIG. 4(a) relative to depth d. The percentage reflection R is dispersed into a series of smaller spikes at the junction between each layer 43(a)-(f) than the single large spike of FIG. 2(c). The spikes at each junction may also re-reflect and thereby recover reflected photons.

Figure 4D:
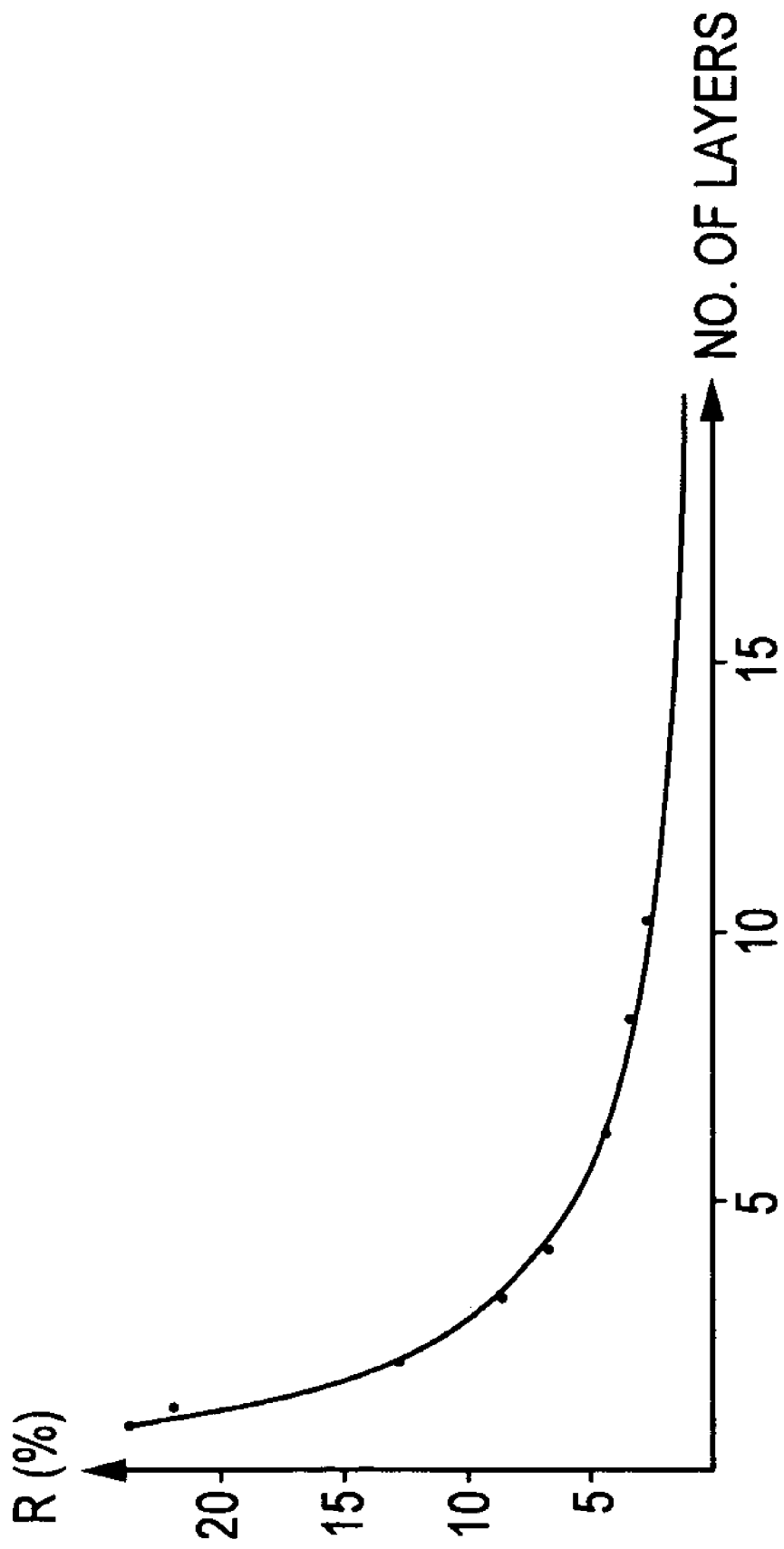
FIG. 4(d) is a plot of the total percentage reflection of all light passing through the stack according to the second exemplary embodiment in relation to the number of discrete transient index layers.

The embodiment shown in FIG. 4(a) uses 6 discrete layers 43(a)-(f), but any number of layers may be used with varying results, as discussed below with respect to FIG. 4(d).

One advantage of the embodiment illustrated in FIG. 4(a) over the embodiment illustrated in FIG. 3(a) is reduced cost of fabrication. In situations where a tradeoff between fabrication cost and percentage of photon reflection is permitted, fabrication cost can be dramatically reduced by employing fewer discrete layers during fabrication. FIG. 4(d) is a plot of the total reflection percentage of an optical stack according to the second exemplary embodiment in relation to the number of discrete transient index layers, illustrating the cost/benefit tradeoff between the number of discrete layers and overall reflection. With a greater number of discrete layers, the change in refractive index n at each junction is less drastic, and produces a smaller series of spikes in reflection percentage R.

Figure 5C:
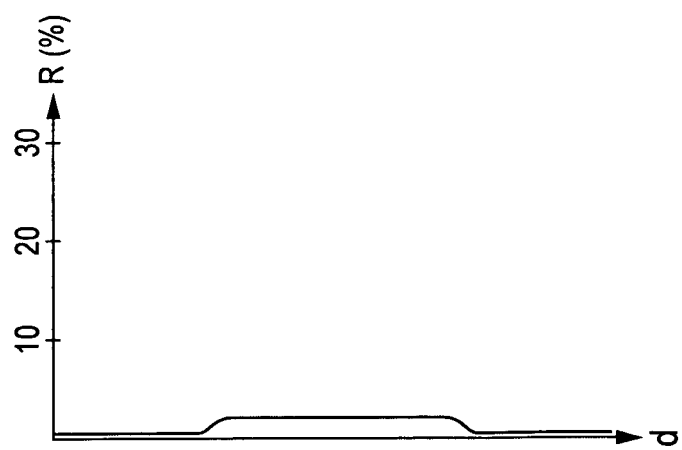
FIG. 5(c) is a plot of the percentage reflection R within the stack of FIG. 5(a) relative to depth d.
Figure 5B:
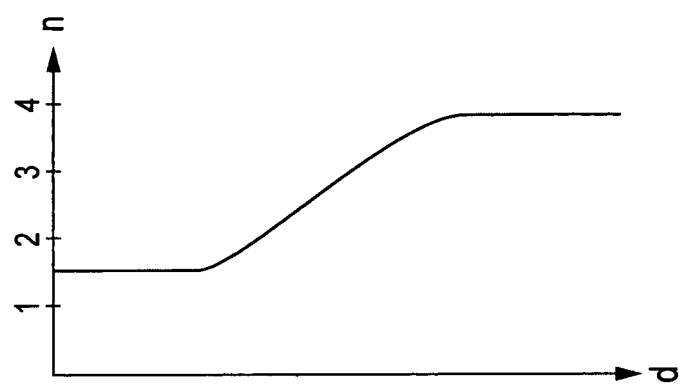
FIG. 5(b) is a plot of the transient index n of a stack of FIG. 5(a), relative to depth.
Figure 5A:
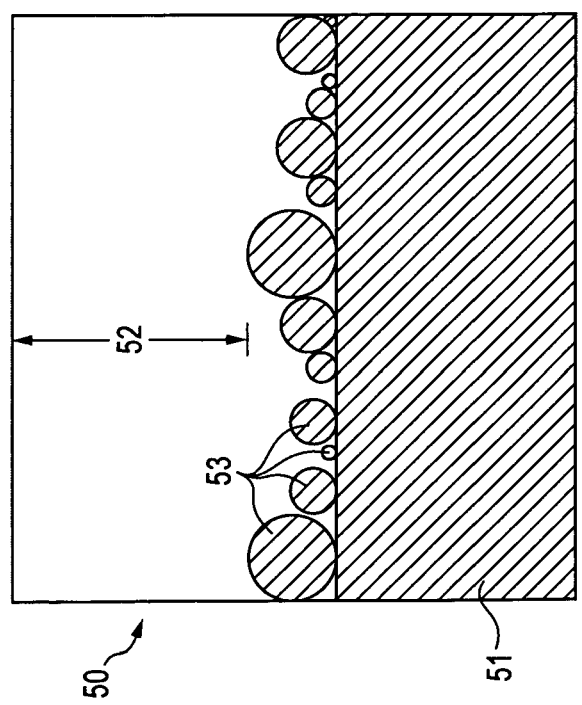
FIG. 5(a) is a cross sectional view of a stack having a silicon dioxide layer formed on a silicon layer and also having an intermediate transient index stack in accordance with a third exemplary embodiment of the invention.

FIG. 5(a) is a cross sectional view of a stack 50 having a silicon dioxide layer 52 formed on a silicon layer 51 and also having an intermediate transient index stack in accordance with a third exemplary embodiment of the invention. FIG. 5(a) shows an intermediate silicon dioxide transient layer containing silicon quantum dots 53 formed therein. By using quantum dots 53 smaller than the wavelength of visible light (<0.2 um) and by adjusting the distribution density of the dots 53 in the intermediate transient index layer, the layer can be made optically equivalent to the optimum intermediate transient index layer 33 of FIG. 3(a).

FIG. 5(b) is a plot of the transient refractive index n of the stack of FIG. 5(a) relative to depth d. Like FIG. 3(b), FIG. 5(a) shows a change in refractive index n relative to depth d that is smoother and less abrupt than at the junction 23 in FIG. 2(b). FIG. 5(c) is a plot of percentage reflection relative to depth d which, like FIG. 3(c), produces less total reflection than the optical stack of FIG. 2(a).

The methods of forming the intermediate transient index layer are flexible and can be adjusted according to the tolerances and desired optical characteristics of the imaging or display device.

Figure 1A:
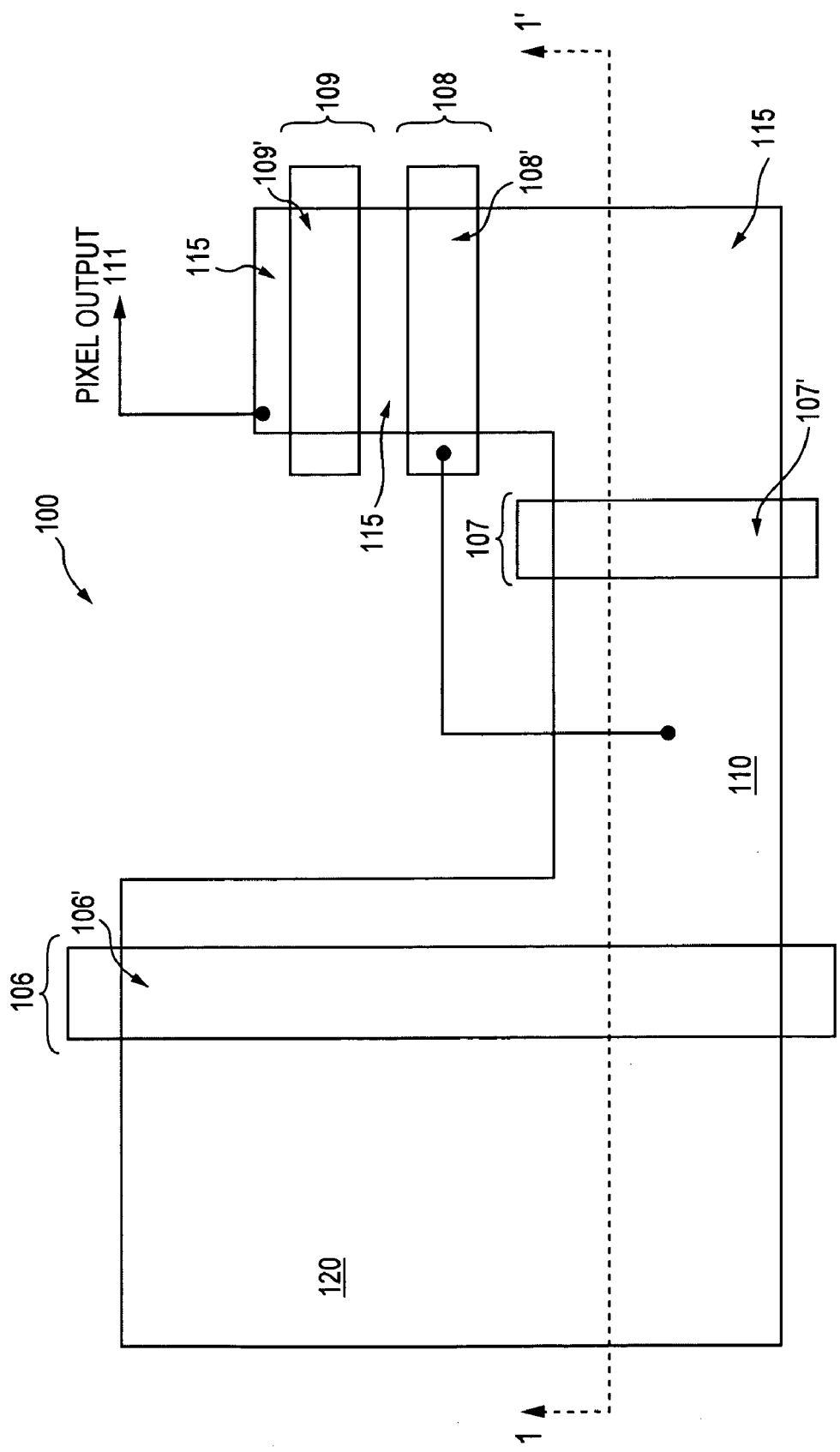
FIG. 1(a) is a top-down view of a conventional four transistor CMOS pixel cell.
Figure 1B:
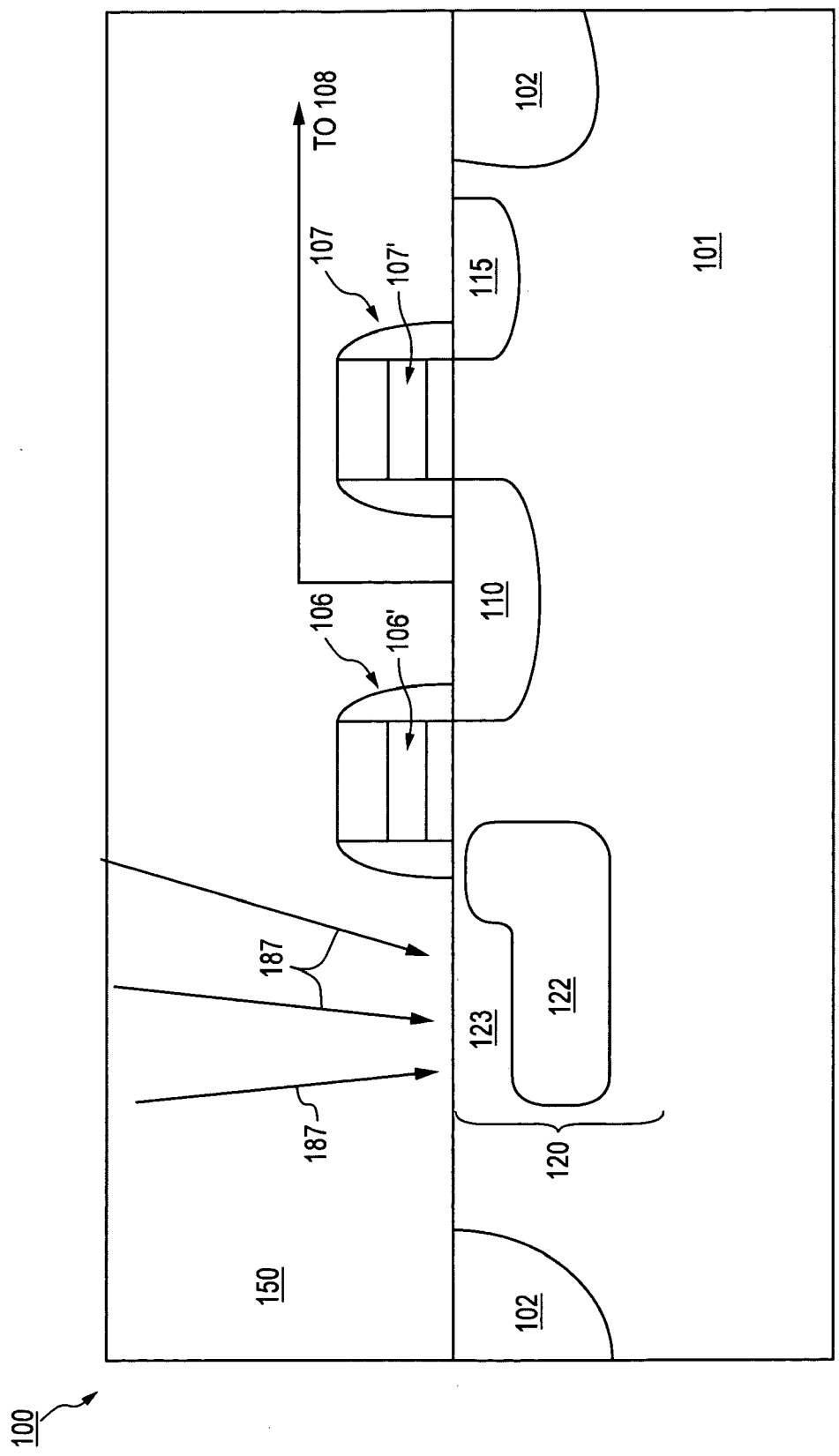
FIG. 1(b) is a cross-sectional view of the pixel cell of FIG. 1(a), taken along line 1-1'.
Figure 1C:
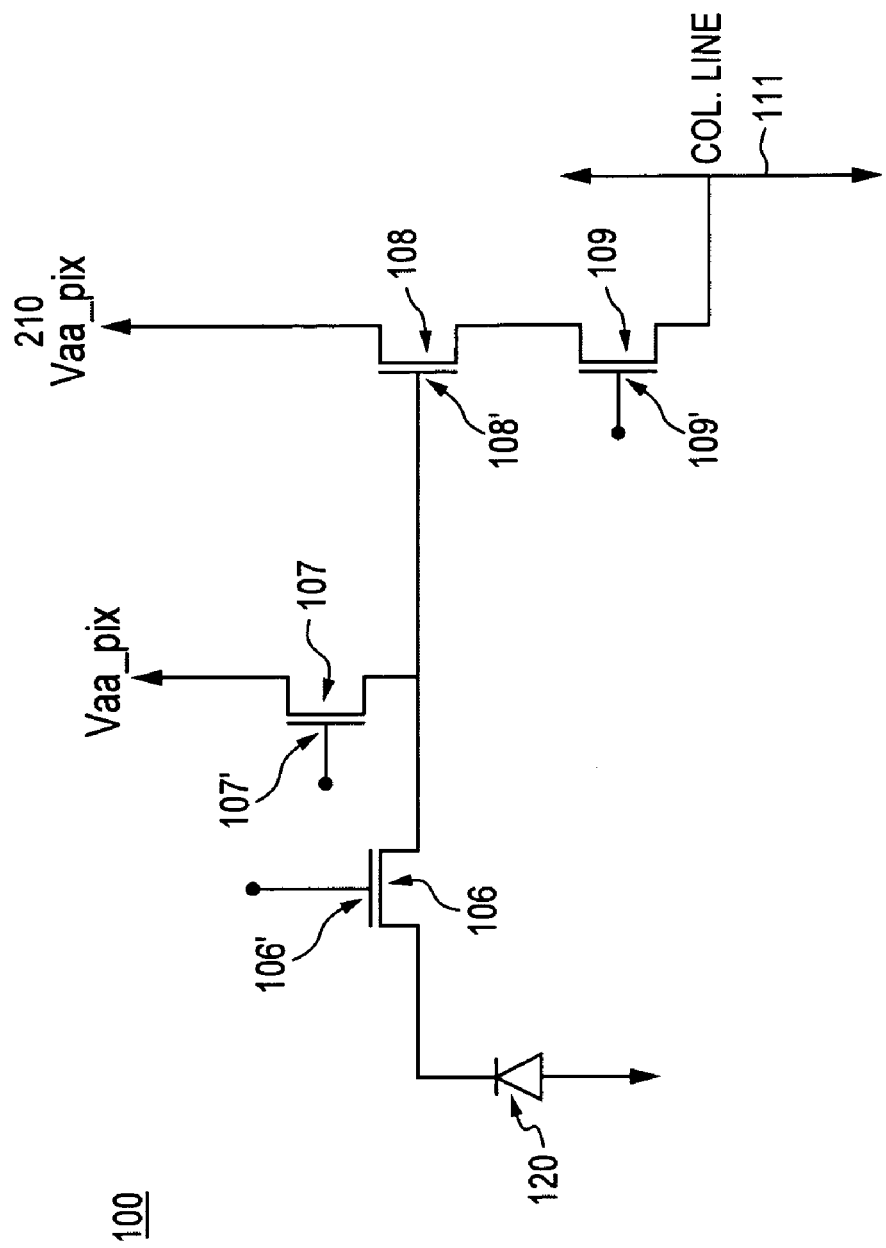
FIG. 1(c) is a circuit diagram of the conventional CMOS pixel of FIGS. 1(a) and (b).
Figure 6:
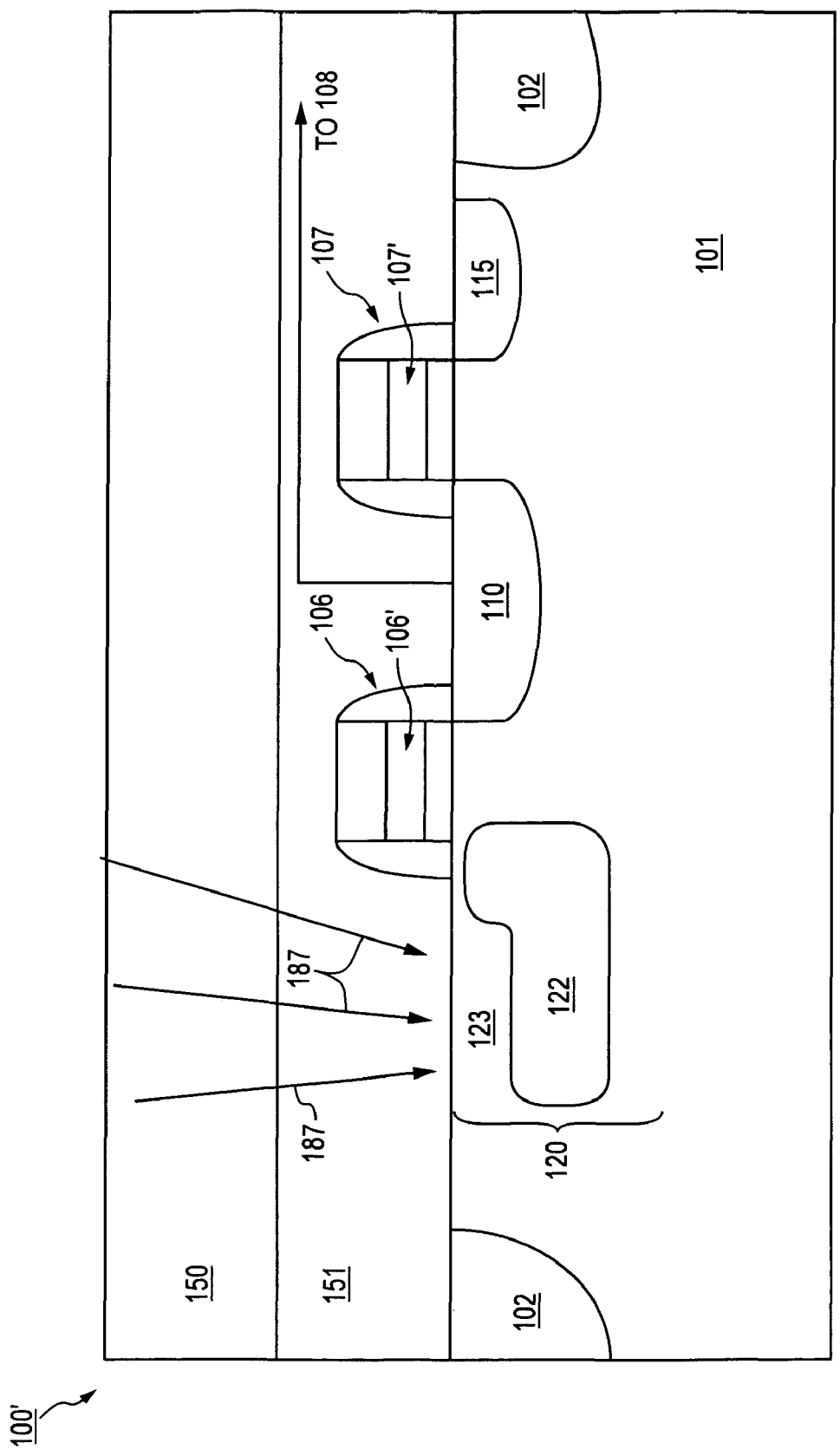
FIG. 6 is a cross-sectional view of a CMOS pixel cell comprising an intermediate transient layer according to the invention.

FIG. 6 illustrates the use of an optical stack, e.g., stacks 30, 40, 50, according to the invention in an imager pixel cell 100', with layer 151 corresponding to an intermediate transient layer according to any one of the embodiments described above. The remainder of the cell 100' may be the same as the conventional cell 100 (FIG. 1(b)).

Figure 7:
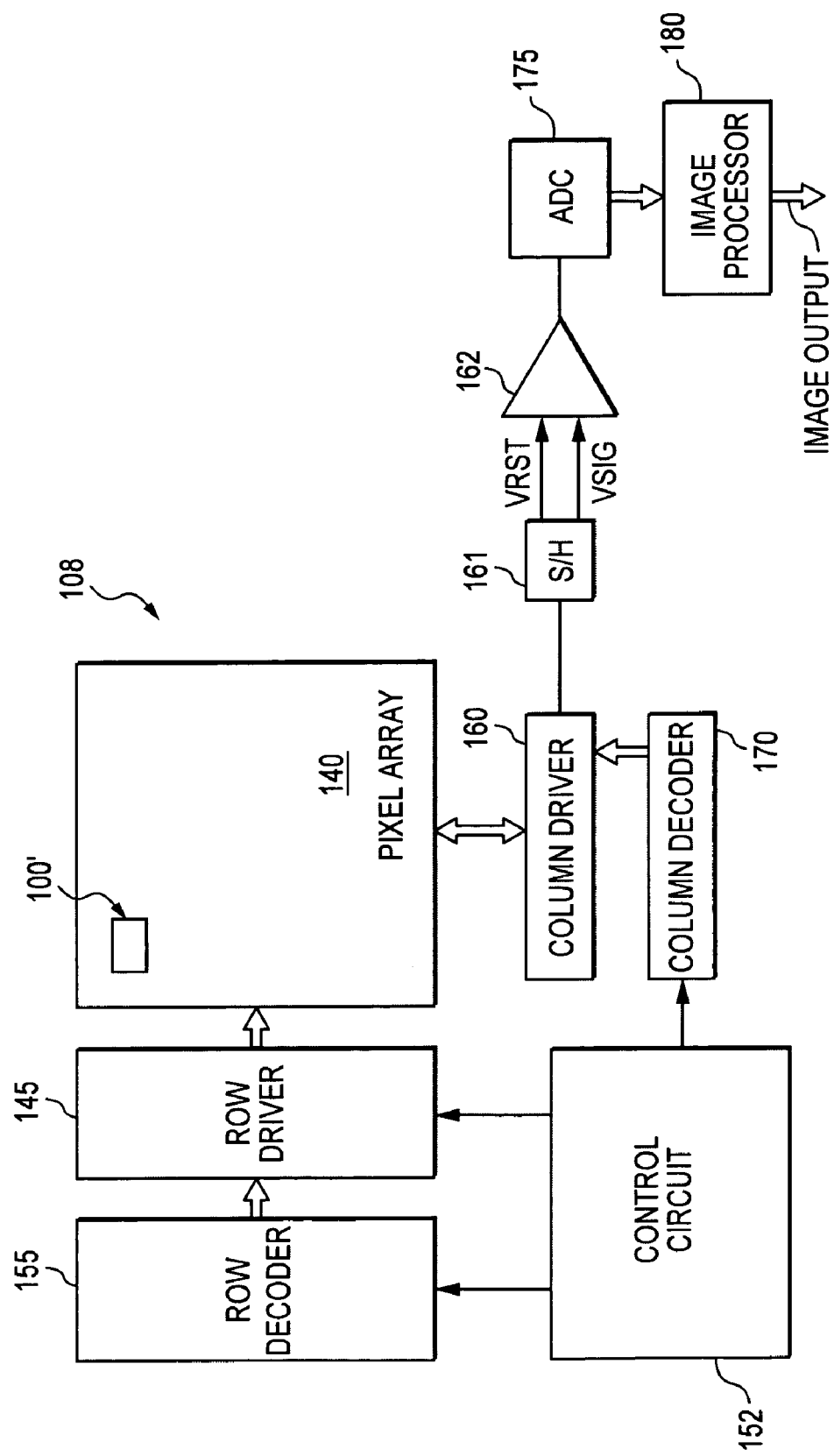
FIG. 7 depicts a block diagram of an imager device constructed in accordance with an embodiment of the invention.

FIG. 7 illustrates a block diagram of an exemplary CMOS imager 108 having a pixel array 140 comprising a plurality of pixel cells 100' arranged in a predetermined number of columns and rows, with each pixel cell being constructed as illustrated and described above with respect to FIG. 6. Other known pixel architectures may be used, but all will include intermediate transient layer 151 as described above with respect to FIG. 6. Attached to the pixel array 140 is signal processing circuitry for controlling the pixel array 140, as described herein, at least part of which may be formed in the substrate. The pixel cells of each row in array 140 are all turned on at the same time by a row select line, and the pixel cells of each column are selectively output by respective column select lines. A plurality of row select and column select lines are provided for the entire array 140. The row lines are selectively activated by a row driver 145 in response to row address decoder 155. The column select lines are selectively activated by a column driver 160 in response to column address decoder 170. Thus, a row and column address is provided for each pixel cell.

The CMOS imager 108 is operated by a timing and control circuit 152, which controls address decoders 155, 170 for selecting the appropriate row and column lines for pixel readout. The control circuit 152 also controls the row and column driver circuitry 145, 160 such that they apply driving voltages to the drive transistors of the selected row and column lines. The pixel column signals, which typically include a pixel reset signal $V_{rst}$ and a pixel image signal $V_{sig}$, are output to column driver 160, on output lines, and are read by a sample and hold circuit 161. $V_{rst}$ is read from a pixel cell 100' immediately after the floating diffusion region 110 is reset. $V_{sig}$ represents the amount of charges generated by the photosensitive element of the pixel cell 100' in response to applied light during an integration period. A differential signal ($V_{rst}$–$V_{sig}$) is produced by differential amplifier 162 for each readout pixel cell. The differential signal is digitized by an analog-to-digital converter 175 (ADC). The analog to digital converter 175 supplies the digitized pixel signals to an image processor 180, which forms and outputs a digital image.

Figure 8:
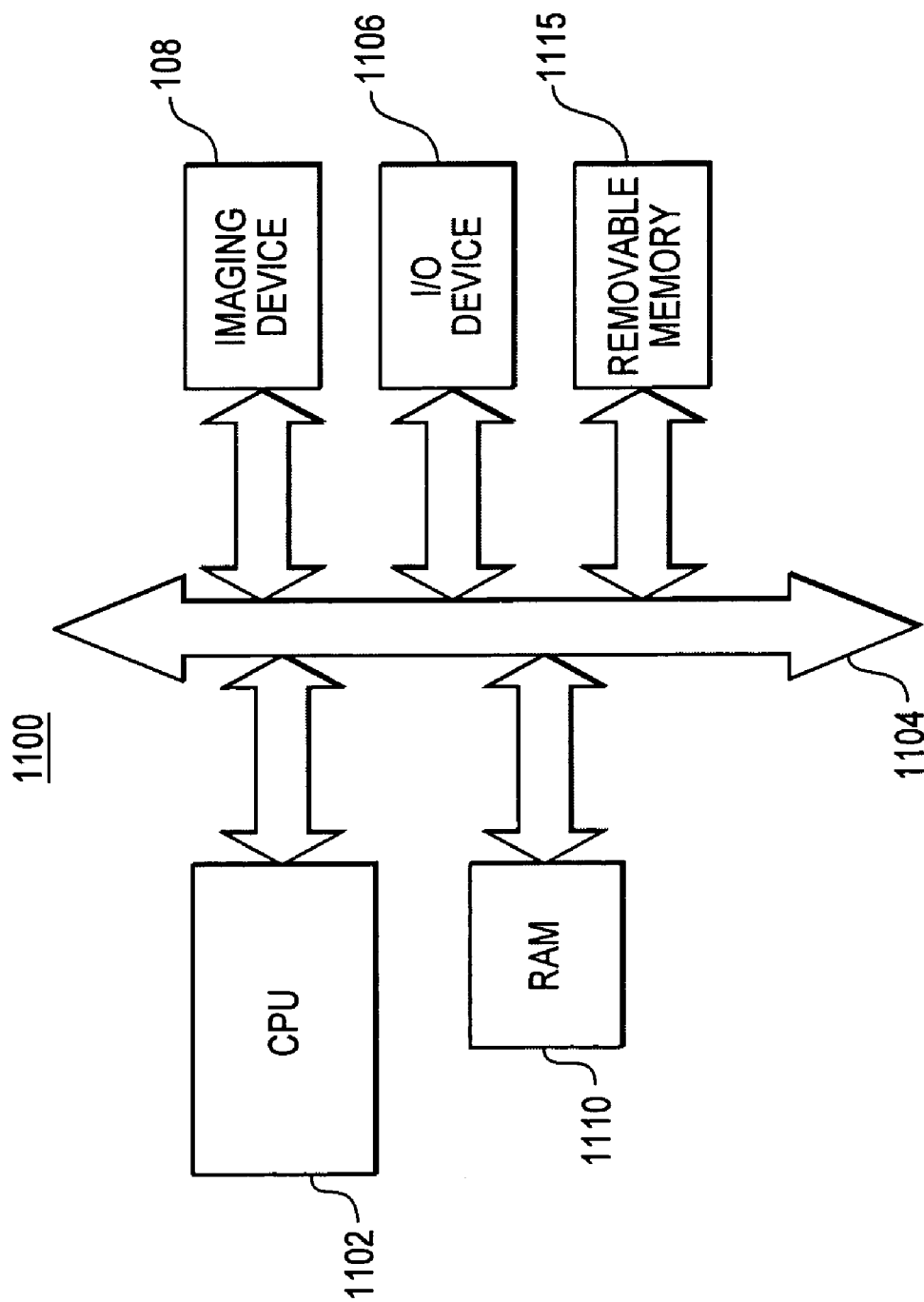
FIG. 8 depicts a processor system incorporating at least one imager device constructed in accordance with an embodiment of the invention.

FIG. 8 illustrates a processor-based system 1100 includes an imaging device 108 constructed in accordance with an embodiment of the invention, CPU 1102, RAM 1110, I/O device 1106, and removable memory 1115. As discussed above, the imaging device 108 contains a pixel array 140 having a plurality of pixel cells 100', each having a transient index stack formed and used as described herein. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other image sensing and/or processing system.

The processor-based system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. The above techniques, structure and system can be applied to display devices employing photoemitters as well. For example, a pixel array similar to the array 140 of FIG. 7, but employing photoemitters employing the present invention rather than photosensors, may be used in a display device to reduce internal reflection and to emit a more accurate signal.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. An optical structure for an imaging device comprising:
   a photo device arranged in a first layer, and
   an associated optical path for the photo device, said optical path comprising:
   the first layer comprising a first material having a first refractive index;
   a second layer comprising a second material having a second refractive index; and
   a transition region comprising the first material and the second material and arranged between said first and second layers and having a refractive index which changes from a value at or about said first refractive index to a value at or about said second refractive index.

2. The optical structure according to claim 1, wherein said transition region comprises a mixture of said first and second materials; and
   wherein a ratio of said first material to said second material in said mixture increases in the direction of the optical path toward the second layer.

3. The optical structure according to claim 2, wherein the increase in the ratio of said first material to said second material in said mixture in the direction of the optical path is proportional to depth in the direction of the optical path toward the second layer.

4. The optical structure according to claim 1,
   wherein the transition region comprises quantum dots of said second material of a size less than 0.2 um within said first material.

5. The optical structure according to claim 1,
   wherein the transition region comprises a stack of discrete transition layers, each layer comprising a uniform mixture of said first and second materials.

6. The optical structure according to claim 5, wherein the ratio of said first material to said second material in each discrete transition layer increases incrementally in the direction of the second layer.

7. The optical structure according to claim 1, wherein the imaging device is adapted to capture an image and said photo device is a photosensor.

8. The optical structure according to claim 1, wherein the imaging device is adapted to display an image and said photo device is a photoemitter.

9. An optical structure for an imaging device comprising:
   a photo device arranged in a first layer, and
   an associated optical path for the photo device, said optical path comprising:
   the first layer comprising a first material having a first refractive index;
   a second layer comprising a second material having a second refractive index; and
   a transition region comprising the first material and the second material and arranged between said first and second layers and having a refractive index which changes from a value at or about said first refractive index to a value at or about said second refractive index,
   wherein said transition region comprises a mixture of said first and second materials,
   wherein a ratio of said first material to said second material in said mixture increases in the direction of the optical path toward the second layer, and
   wherein said first material is silicon dioxide and said second material is silicon.

10. The optical structure according to claim 9, wherein said silicon is provided as a substrate for said photo device.

11. The optical structure according to claim 9, wherein the increase in the ratio of said first material to said second material in said mixture in the direction of the optical path is proportional to depth in the direction of the optical path toward the second layer.

12. The optical structure according to claim 9, wherein the imaging device is adapted to capture an image and said photo device is a photosensor.

13. The optical structure according to claim 9, wherein the imaging device is adapted to display an image and said photo device is a photoemitter.

14. An imaging system comprising:
a CPU; and
an imaging device comprising an optical structure, said optical structure comprising:
a photo device arranged in a first layer, and
an associated optical path for the photo device, said optical path comprising:
the first layer comprising a first material having a first refractive index;
a second layer comprising a second material having a second refractive index; and
a transition region comprising the first material and the second material and arranged between said first and second layers and having a refractive index which changes from a value at or about said first refractive index to a value at or about said second refractive index.

15. The system according to claim 14, wherein
said transition region comprises a mixture of said first and second materials; and
wherein a ratio of said first material to said second material in said mixture increases in the direction of the optical path toward the second layer.

16. The system according to claim 15, wherein the increase in the ratio of said first material to said second material in said mixture in the direction of the optical path is proportional to depth in the direction of the optical path toward the second layer.

17. The imaging system according to claim 14,
wherein the transition region comprises quantum dots of said second material of a size less than 0.2 um within said first material.

18. The imaging system according to claim 14,
wherein the transition region comprises a stack of discrete transition layers, each layer comprising a uniform mixture of said first and second materials.

19. The system according to claim 18, wherein the ratio of said first material to said second material in each discrete transition layer increases incrementally in the direction of the second layer.

20. The system according to claim 14, wherein the imaging device is adapted to capture an image and said photo device is a photosensor.

21. The system according to claim 14, wherein the imaging device is adapted to display an image and said photo device is a photoemitter.

22. An imaging system comprising:
a CPU; and
an imaging device comprising an optical structure, said optical structure comprising:
a photo device arranged in a first layer, and
an associated optical path for the photo device, said optical path comprising:
the first layer comprising a first material having a first refractive index;
a second layer comprising a second material having a second refractive index; and
a transition region comprising the first material and the second material and arranged between said first and second layers and having a refractive index which changes from a value at or about said first refractive index to a value at or about said second refractive index,
wherein said transition region comprises a mixture of said first and second materials,
wherein a ratio of said first material to said second material in said mixture increases in the direction of the optical path toward the second layer, and
wherein said first material is silicon dioxide and said second material is silicon.

23. The system according to claim 22, wherein said silicon is provided as a substrate for said photo device.

24. The system according to claim 22, wherein the increase in the ratio of said first material to said second material in said mixture in the direction of the optical path is proportional to depth in the direction of the optical path toward the second layer.

25. The system according to claim 22, wherein the imaging device is adapted to capture an image and said photo device is a photosensor.

26. The system according to claim 22, wherein the imaging device is adapted to display an image and said photo device is a photoemitter.

* * * * *